(12) United States Patent
Khlat et al.

(10) Patent No.: US 11,387,795 B2
(45) Date of Patent: *Jul. 12, 2022

(54) UPLINK MULTIPLE INPUT-MULTIPLE OUTPUT (MIMO) TRANSMITTER APPARATUS WITH PRE-DISTORTION

(71) Applicant: Qorvo US, Inc., Greensboro, NC (US)

(72) Inventors: Nadim Khlat, Cugnaux (FR); Terry J. Stockert, Cedar Rapids, IA (US)

(73) Assignee: QORVO US, INC., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/154,394

(22) Filed: Jan. 21, 2021

(65) Prior Publication Data

US 2021/0234520 A1 Jul. 29, 2021

Related U.S. Application Data

(60) Provisional application No. 62/966,570, filed on Jan. 28, 2020.

(51) Int. Cl.

| *H03F 3/24* | (2006.01) |
|---|---|
| *H03F 3/21* | (2006.01) |
| *H04B 7/0452* | (2017.01) |
| *H04B 1/04* | (2006.01) |
| *H03F 1/32* | (2006.01) |

(52) U.S. Cl.
CPC .............. *H03F 3/24* (2013.01); *H03F 1/3241* (2013.01); *H03F 3/211* (2013.01); *H04B 1/0475* (2013.01); *H04B 7/0452* (2013.01)

(58) Field of Classification Search
CPC ........................... H04B 1/0475; H04B 7/0452

USPC ........................................................ 375/297
See application file for complete search history.

(56) References Cited

U.S. PATENT DOCUMENTS

| 10,177,830 B2 | 1/2019 | Maehata |
| 2004/0266365 A1 | 12/2004 | Hasson et al. |
| 2006/0077075 A1* | 4/2006 | Immink ............... G11B 7/0941 341/50 |

(Continued)

OTHER PUBLICATIONS

U.S. Appl. No. 17/149,917 (Year: 2021).*

(Continued)

*Primary Examiner* — Kevin M Burd
(74) *Attorney, Agent, or Firm* — Withrow & Terranova, P.L.L.C.

(57) ABSTRACT

An uplink multiple input-multiple output (MIMO) transmitter apparatus includes a transmitter chain that includes a sigma-delta circuit that creates a summed (sigma) signal and a difference (delta) signal from two original signals to be transmitted. These new sigma and delta signals are amplified by power amplifiers to a desired output level before having two signals reconstructed from the amplified sigma and amplified delta signals by a second circuit. These reconstructed signals match the two original signals in content but are at a desired amplified level relative to the two original signals. The reconstructed signals are then transmitted through respective antennas as uplink signals. By employing this uplink MIMO transmitter apparatus, it is possible to use smaller power amplifiers, which may reduce footprint, power consumption, and costs of the uplink MIMO transmitter apparatus.

19 Claims, 13 Drawing Sheets

(56) References Cited

U.S. PATENT DOCUMENTS

| | | |
|---|---|---|
| 2008/0037662 A1 | 2/2008 | Ravi et al. |
| 2008/0187035 A1* | 8/2008 | Nakamura ............ H03F 3/245 |
| | | 375/232 |
| 2010/0182090 A1* | 7/2010 | Yang ..................... H03F 3/72 |
| | | 330/277 |
| 2014/0340160 A1* | 11/2014 | Kuroda .................. H03F 1/56 |
| | | 330/310 |
| 2016/0336973 A1 | 11/2016 | Aono et al. |
| 2020/0295790 A1* | 9/2020 | Langer ................ H03F 1/3258 |
| 2020/0382066 A1 | 12/2020 | Khlat |
| 2020/0403661 A1 | 12/2020 | Khlat |

OTHER PUBLICATIONS

U.S. Appl. No. 17/144,825 (Year: 2021).*
Notice of Allowance for U.S. Appl. No. 17/149,917, dated Jan. 11, 2022, 8 pages.

* cited by examiner

UPLINK MULTIPLE INPUT-MULTIPLE OUTPUT (MIMO) TRANSMITTER APPARATUS WITH PRE-DISTORTION

RELATED APPLICATIONS

This application claims the benefit of U.S. provisional patent application Ser. No. 62/966,570, filed Jan. 28, 2020, the disclosure of which is hereby incorporated herein by reference in its entirety.

FIELD OF THE DISCLOSURE

The technology of the disclosure relates generally to a radio frequency (RF) transmitter.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Wi-Fi, long-term evolution (LTE), and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

5G-NR, in particular, relies on multiple input-multiple output (MIMO) techniques to enable high-bandwidth communication where plural antennas and transceiver chains may transmit data signals concurrently. Traditional MIMO techniques typically use a separate power amplifier for each transceiver chain. These power amplifiers may be bulky to handle required power levels, which can lead to increased footprint, power consumption, and costs. Hence, there may be room for improvement in providing power amplification to MIMO circuits.

SUMMARY

Embodiments of the disclosure relate to an uplink multiple input-multiple output (MIMO) transmitter apparatus with pre-distortion. In a non-limiting example, a transmitter chain or circuit includes a sigma-delta circuit that creates a summed (sigma) signal and a difference (delta) signal from two original signals to be transmitted. These new sigma and delta signals are amplified by power amplifiers to a desired output level before having two signals reconstructed from the amplified sigma and amplified delta signals by a second circuit. These reconstructed signals match the two original signals in content but are at a desired amplified level relative to the two original signals. An exemplary sigma-delta circuit uses a plurality of inductors, which may cross-couple causing the signals to be distorted. Exemplary aspects of the present disclosure provide a circuit that pre-distorts the signals to offset the cross-coupling from the inductors. Such pre-distortion provides a better signal for transmission in the uplink MIMO transmitter apparatus, while preserving the advantages of the sigma-delta circuit.

In one aspect, a transmitter apparatus is disclosed. The transmitter apparatus comprises a first sigma-delta network. The first sigma-delta network comprises an input configured to receive a first signal and a second signal. The first sigma-delta network also comprises a first compensation circuit configured to provide a first compensation signal. The first sigma-delta network also comprises first additive circuitry configured to sum the first signal, the first compensation signal, and the second signal to create a sigma signal. The first sigma-delta network also comprises a second compensation circuit configured to provide a second compensation signal. The first sigma-delta network also comprises first difference circuitry configured to subtract the second signal from a sum of the second compensation signal and the first signal to create a delta signal. The first sigma-delta network also comprises a sigma output coupled to the first additive circuitry. The first sigma-delta network also comprises a delta output coupled to the first difference circuitry. The transmitter apparatus also comprises a first power amplifier coupled to the sigma output. The first power amplifier comprises a summed output. The transmitter apparatus also comprises a second power amplifier coupled to the delta output. The second power amplifier comprises a difference output. The transmitter apparatus also comprises a second sigma-delta network. The second sigma-delta network comprises a summed input coupled to the summed output and configured to receive an amplified sigma signal. The second sigma-delta network also comprises a difference input coupled to the difference output and configured to receive an amplified delta signal. The second sigma-delta network also comprises second additive circuitry configured to sum the amplified sigma signal and the amplified delta signal to create an amplified first signal. The second sigma-delta network also comprises second difference circuitry configured to subtract the amplified delta signal from the amplified sigma signal to create an amplified second signal. The second sigma-delta network also comprises a first output coupled to the second additive circuitry. The second sigma-delta network also comprises a second output coupled to the second difference circuitry.

In another aspect, a transceiver circuit is disclosed. The transceiver circuit comprises a sigma-delta network. The sigma-delta network comprises an input configured to receive a first signal and a second signal. The sigma-delta network also comprises a first compensation circuit configured to provide a first compensation signal. The sigma-delta network also comprises first additive circuitry configured to sum the first signal, the first compensation signal, and the second signal to create a sigma signal. The sigma-delta network also comprises a second compensation circuit configured to provide a second compensation signal. The sigma-delta network also comprises first difference circuitry configured to subtract the second signal from a sum of the second compensation signal and the first signal to create a delta signal. The sigma-delta network also comprises a sigma output coupled to the first additive circuitry. The sigma-delta network also comprises a delta output coupled to the first difference circuitry.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
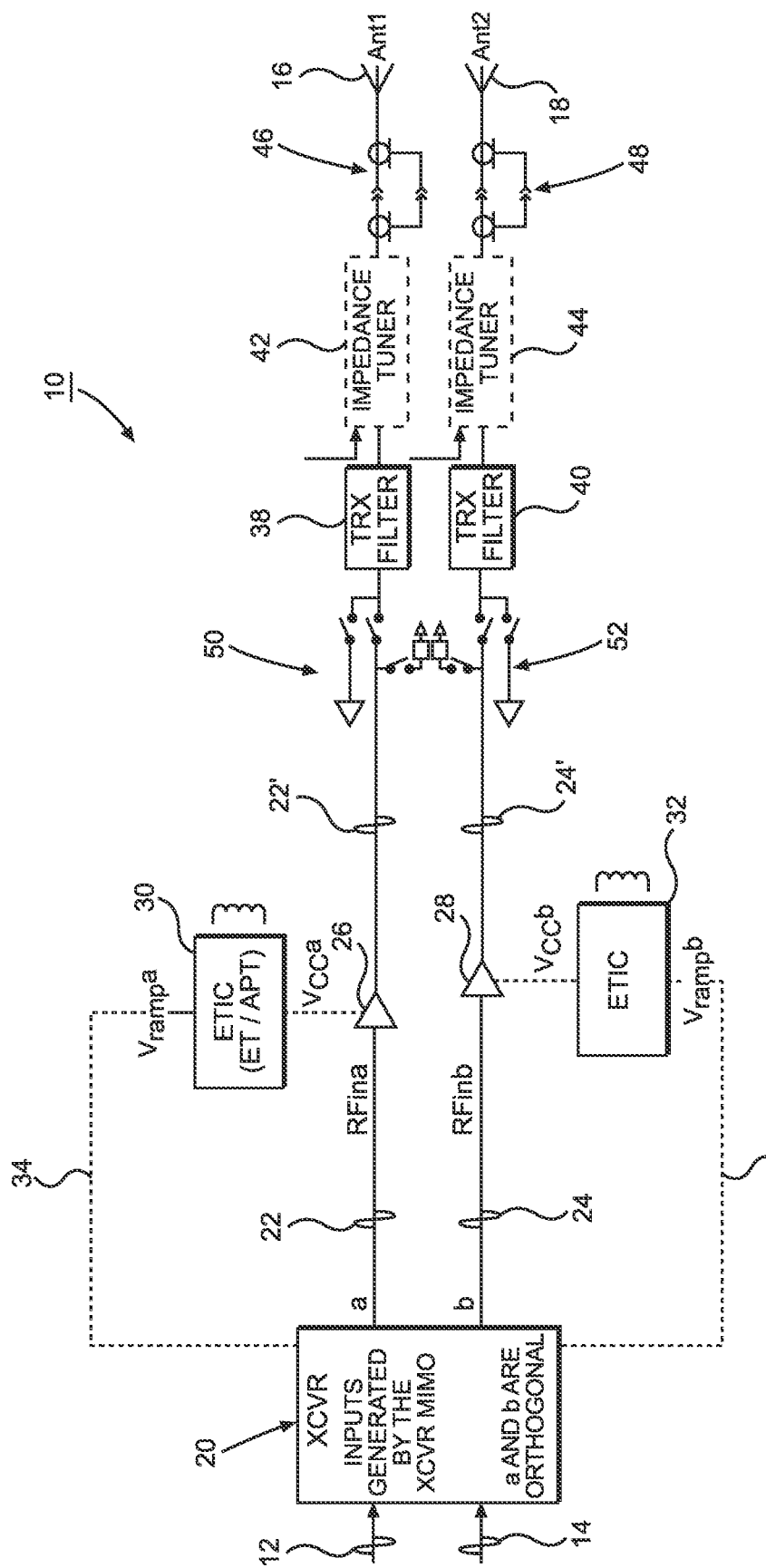
FIG. 1 is a schematic diagram of an exemplary conventional multiple input-multiple output (MIMO) transmitter apparatus configured to amplify a pair of input signals for concurrent transmission from a pair of antennas.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an uplink multiple input-multiple output (MIMO) transmitter apparatus with pre-distortion. In a non-limiting example, a transmitter chain or circuit includes a sigma-delta circuit that creates a summed (sigma) signal and a difference (delta) signal from two original signals to be transmitted. These new sigma and delta signals are amplified by power amplifiers to a desired output level before having two signals reconstructed from the amplified sigma and amplified delta signals by a second circuit. These reconstructed signals match the two original signals in content but are at a desired amplified level relative to the two original signals. An exemplary sigma-delta circuit uses a plurality of inductors, which may cross-couple causing the signals to be distorted. Exemplary aspects of the present disclosure provide a circuit that pre-distorts the signals to offset the cross-coupling from the inductors. Such pre-distortion provides a better signal for transmission in the uplink MIMO transmitter apparatus, while preserving the advantages of the sigma-delta circuit.

Before discussing a pre-distortion circuit in a transmitter apparatus that offsets unwanted inductive coupling, an overview of a conventional transmitter apparatus is first provided with reference to FIG. 1 to help understand the challenges associated with amplifying multiple radio frequency (RF) signals. A discussion of a transmitter apparatus having a sigma-delta circuit that may include inductors is provided with reference to FIGS. 2 through 9. FIG. 10 provides an explanation of how unwanted inductive coupling may originate in the sigma-delta circuits that employ inductors. A discussion of an exemplary solution begins at FIG. 11.

In this regard, FIG. 1 is a schematic diagram of an exemplary conventional transmitter apparatus 10 configured to amplify a first input signal 12 and a second input signal 14 for concurrent transmission from a first antenna 16 and a second antenna 18, respectively.

The conventional transmitter apparatus 10 includes a transceiver circuit 20 configured to receive the first input signal 12 and the second input signal 14. The transceiver circuit 20 is configured to generate a first RF signal 22, sometimes referred to as signal a or RFina, from the first input signal 12 and a second RF signal 24, sometimes referred to as signal b or RFinb, from the second input signal 14.

The conventional transmitter apparatus 10 includes two (2) power amplifier circuits 26 and 28 to amplify the first RF signal 22 and the second RF signal 24, respectively. The two power amplifier circuits 26 and 28 are controlled by envelope tracking integrated circuits (ETICs) 30 and 32, respectively. The ETICs 30 and 32 are controlled by $V_{ramp}a$ signal 34 and $V_{ramp}b$ signal 36 from the transceiver circuit 20. Control and use of ETICs 30 and 32 is prevalent in the industry and not central to the present disclosure so further discussion is omitted. However, the interested reader is directed to U.S. Patent Application Publication No. 2020/0382066 for further information.

After amplification, signals 22' and 24' are provided to respective filters 38 and 40. The filters 38 and 40 are coupled to impedance tuners 42 and 44, respectively. The impedance tuners 42 and 44 are coupled to the antennas 16 and 18, respectively, such as through a coaxial or flex line connection (noted at 46 and 48, respectively). In some instances, there may be no signal being provided to an antenna. In such instances, the line with no signal may be terminated to a known voltage level (e.g., to ground). Accordingly, termination structures 50 and 52 are provided to provide such terminations.

There are three typical scenarios for use of the conventional transmitter apparatus 10. A first use case occurs when one signal (e.g., signal 22 or signal 24) is active at full power and the other signal is dormant or inactive. To handle this power requirement, the power amplifier circuits 26 and 28 are sized sufficiently large that they can produce the peak power. A second use case occurs when the signals 22 and 24 are equal and each is one-half the peak power such that the sum of the two amplified signals is equal to the peak power. As the power amplifier circuits 26 and 28 are sized to handle peak power, the power amplifier circuits 26 and 28 can produce the two half-peak power signals. A third use case occurs when the signals 22 and 24 are unequal, but cumulatively are less than or equal to the peak power. Again, as the power amplifier circuits 26 and 28 are sized to handle peak power, the power amplifier circuits 26 and 28 can produce the two unequal power signals.

Because of the need to handle peak power for either signal, each of the power amplifier circuits 26 and 28 is sized to produce such peak power and may occupy a relatively large footprint, consume power, and cost more than smaller power amplifiers. Further, having the two ETICs 30 and 32 likewise occupies a relatively large footprint, consumes power, and incurs a component cost. Hence, it is desirable to change the structure of the power amplifier circuits 26 and 28 as well as eliminate one of the ETICs 30 and 32 to help reduce footprint, power consumption, and cost.

Figure 2:
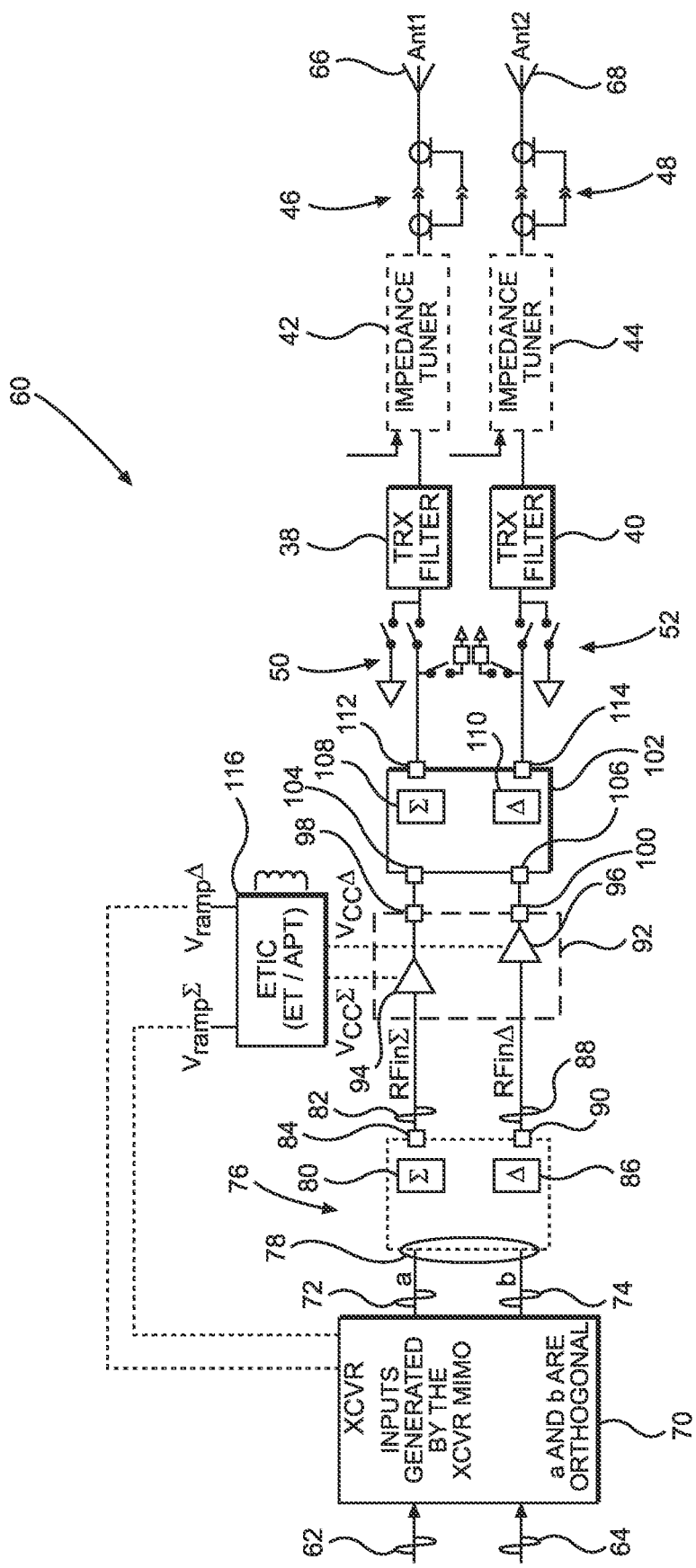
FIG. 2 is a schematic diagram of an exemplary MIMO transmitter apparatus configured according to an embodiment of the present disclosure to create (with a network circuit) sum (sigma) and difference (delta) signals to be amplified before reconstruction of amplified versions of input signals for transmission through antennas.

In this regard, FIG. 2 is a schematic diagram of an exemplary transmitter apparatus 60 configured with a sigma-delta circuit that allows the power amplifier circuits to be reduced in size, yet still provide desired output levels for the signals as well as eliminate one of the ETICs. The transmitter apparatus 60 is configured to amplify a first input signal 62 and a second input signal 64 for concurrent transmission from a first antenna 66 and a second antenna 68, respectively.

The transmitter apparatus 60 includes a transceiver circuit 70 configured to receive the first input signal 62 and the second input signal 64. The transceiver circuit 70 is configured to generate a first RF signal 72, sometimes referred to as signal a, from the first input signal 62 and a second RF signal 74, sometimes referred to as signal b, from the second input signal 64. It should be appreciated that signals a and b may be formed by the transceiver circuit 70 to be orthogonal.

The transceiver circuit 70 is coupled to a sigma-delta circuit 76. In particular, the sigma-delta circuit 76 includes an input 78 configured to receive the first RF signal 72 and the second RF signal 74. The sigma-delta circuit 76 includes additive circuitry 80 configured to sum the first RF signal 72 with the second RF signal 74 to create a sigma signal 82 (sometimes labeled RFinΣ) which is provided at a sigma output 84 of the sigma-delta circuit 76. The sigma-delta circuit 76 further includes difference circuitry 86 configured to subtract the second RF signal 74 from the first RF signal 72 to create a delta signal 88 (sometimes labeled RFinΔ), which is provided at a delta output 90 of the sigma-delta circuit 76.

The sigma signal 82 and the delta signal 88 are provided to a power amplifier network 92, which includes a first power amplifier circuit 94 coupled to the sigma output 84 and a second power amplifier circuit 96 coupled to the delta output 90. The first power amplifier circuit 94 includes a summed output 98, and the second power amplifier circuit 96 includes a difference output 100. The summed output 98 and the difference output 100 are coupled to a second sigma-delta circuit 102.

The second sigma-delta circuit 102 includes a summed input 104 coupled to the summed output 98 and is configured to receive an amplified sigma signal therefrom. The second sigma-delta circuit 102 also includes a difference input 106 coupled to the difference output 100 and is configured to receive an amplified delta signal therefrom. The second sigma-delta circuit 102 includes additive circuitry 108 configured to sum the amplified sigma signal and the amplified delta signal to create an amplified first signal. The second sigma-delta circuit 102 includes difference circuitry 110 configured to subtract the amplified delta signal from the amplified sigma signal to create an amplified second signal. The amplified first signal is produced at an output 112 while the amplified second signal is produced at an output 114. The output 112 is coupled to the additive circuitry 108 and the output 114 is coupled to the difference circuitry 110. The amplified first signal corresponds to an amplified version of the first RF signal 72 while the amplified second signal corresponds to an amplified version of the second RF signal 74.

The amplified first signal and the amplified second signal are provided to the filters 38 and 40, respectively. The filters 38 and 40 are coupled to the impedance tuners 42 and 44, respectively. The impedance tuners 42 and 44 are coupled to the antennas 66 and 68, respectively, such as through a coaxial or flex line connection (noted at 46 and 48, respectively). In some instances, there may be no signal being provided to an antenna. In such instances, the line with no signal may be terminated to a known voltage level (e.g., to ground). Accordingly, the termination structures 50 and 52 are provided to provide such terminations. Note that the structures between the second sigma-delta circuit 102 and the antennas 66, 68 are identical between FIGS. 1 and 2.

By amplifying the sigma signal (i.e., a+b) and the delta signal (a−b), and then recombining the amplified signals through the second sigma-delta circuit 102, the requirements on the power amplifiers is lessened such that the power amplifiers now only need be capable of supporting half peak power. This reduced requirement allows the size of the power amplifier to be reduced, which in turn reduces space utilization and cost. While there is some offsetting space loss using the sigma-delta circuits, there is a net space savings.

The power amplifier network 92 is controlled by two signals (VccΣ and VccΔ) from an ETIC 116, which receives two control signals (VrampΣ and VrampΔ) from the transceiver circuit 70.

Figure 3:
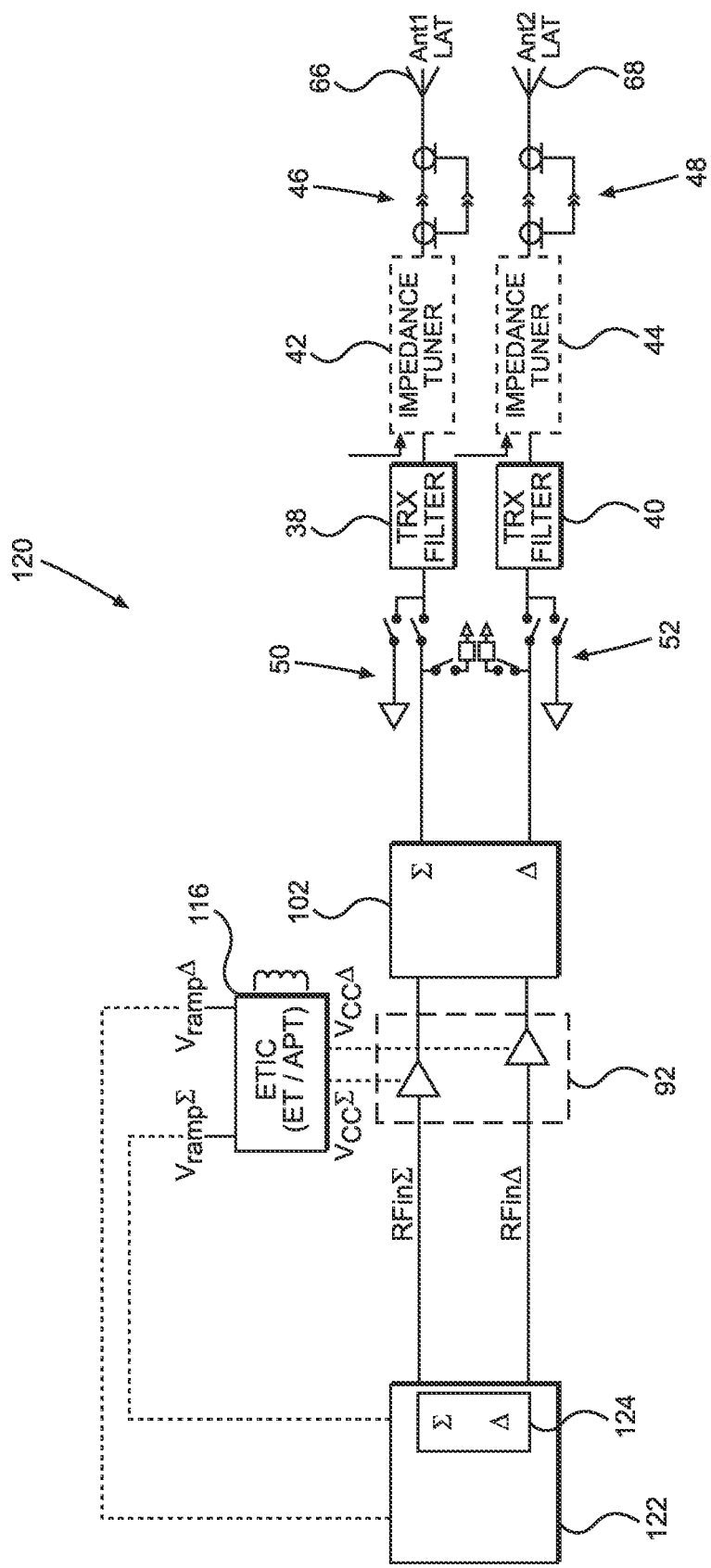
FIG. 3 is a schematic diagram of an exemplary MIMO transmitter apparatus configured according to an embodiment of the present disclosure to create sum (sigma) and difference (delta) signals within a transceiver circuit.
Figure 4:
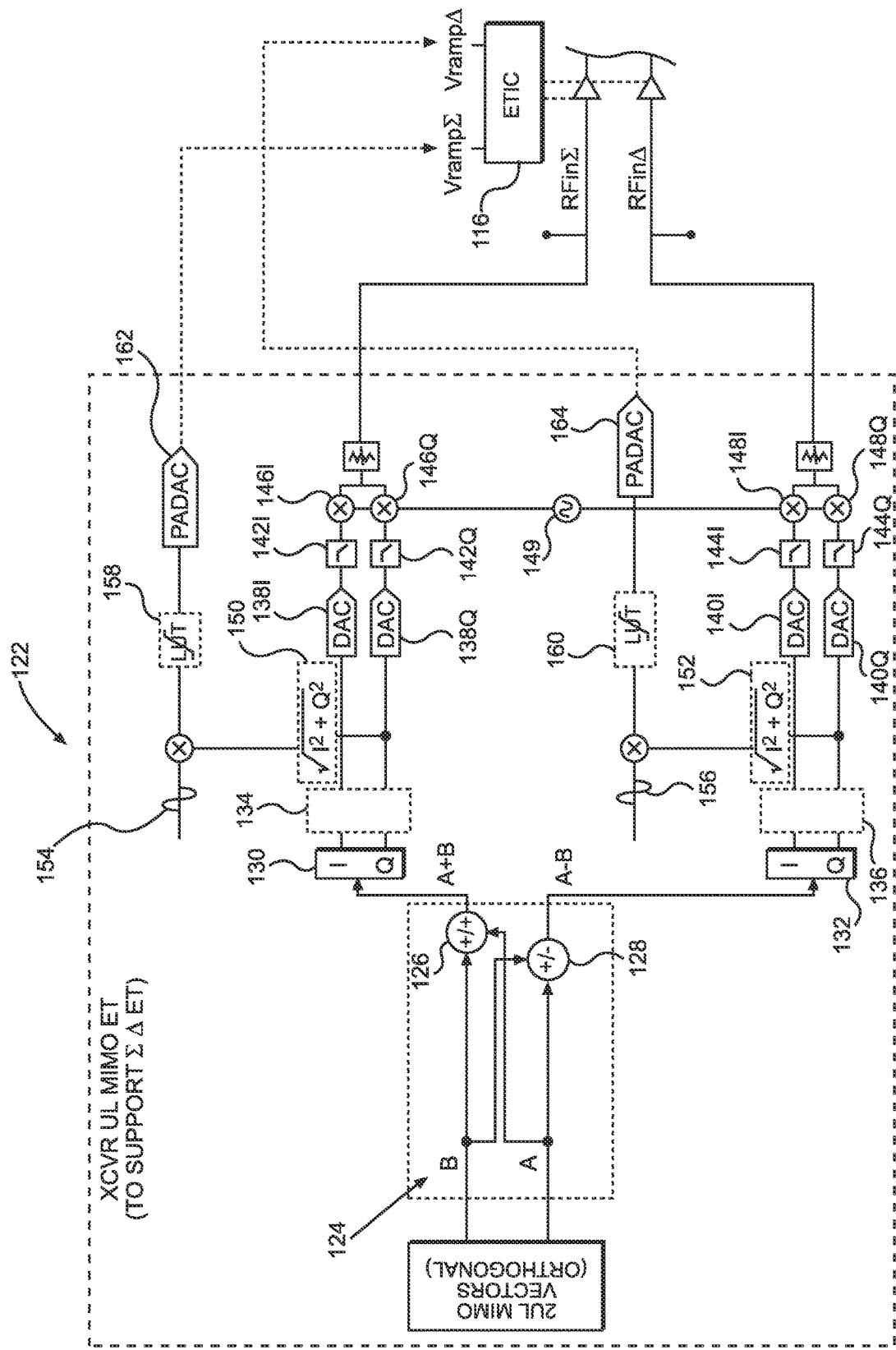
FIG. 4 is a schematic diagram of the details of the transceiver circuit of FIG. 3.

While the transmitter apparatus 60 of FIG. 2 contemplates a first sigma-delta circuit 76 distinct from the transceiver circuit 70, a transceiver circuit may include the first sigma delta circuit as better illustrated by the transmitter apparatus illustrated in FIGS. 3 and 4. Specifically, a transmitter apparatus 120 includes a transceiver circuit 122 that includes a first sigma-delta circuit 124, better illustrated in FIG. 4. The remaining elements of the transmitter apparatus 120 are essentially identical to the transmitter apparatus 60 of FIG. 2 and a repeated discussion is omitted.

With reference to FIG. 4, the transceiver circuit 122 starts with two signals (A, B) that are orthogonal in nature and have the same average power. This starting assumption is accurate for most currently contemplated signaling schemes for current cellular communication. The two signals may start at a baseband frequency and are summed by summing or additive circuitry 126 to create a sigma signal (A+B). The two signals are likewise manipulated by difference circuitry 128 to create a delta signal (A−B). The sigma and delta signals are then converted to complex form by generating an In-Phase (I) and Quadrature Phase (Q) component by circuits 130, 132, respectively. Digital pre-distortion (DPD) is applied by DPD circuits 134, 136, respectively. This pre-distortion inside the transceiver circuit 122 allows cross-DPD to compensate for non-linearities in the power amplifiers as needed or desired. The outputs of the DPD circuits 134, 136 are converted to an analog form by digital-to-analog converters (DACs) 138I, 138Q, 140I, and 140Q before filtering by filters 142I, 142Q, 144I, and 144Q. The filtered signals are upconverted to an RF frequency by mixers 146I, 146Q, 148I, and 148Q using a signal from an oscillator 149 before being recombined and sent to the power amplifier network 92 (FIG. 3).

The control signals for the ETIC 112 are derived by finding an amplitude of an envelope by taking the square root of the sum of squares of the I and Q components. That is circuits 150, 152 calculate the envelope as follows:

$$\sqrt[2]{I^2 + Q^2}.$$

The amplitude of the envelope is multiplied by respective gain input scaling terms 154, 156 (sometimes referred to as gain_scale) and passed to a look-up table (LUT) 158, 160. The output of the LUT 158, 160 is passed to a DAC 162, 164, to generate VrampΣ and VrampΔ which are used by the ETIC 112.

Figure 5:
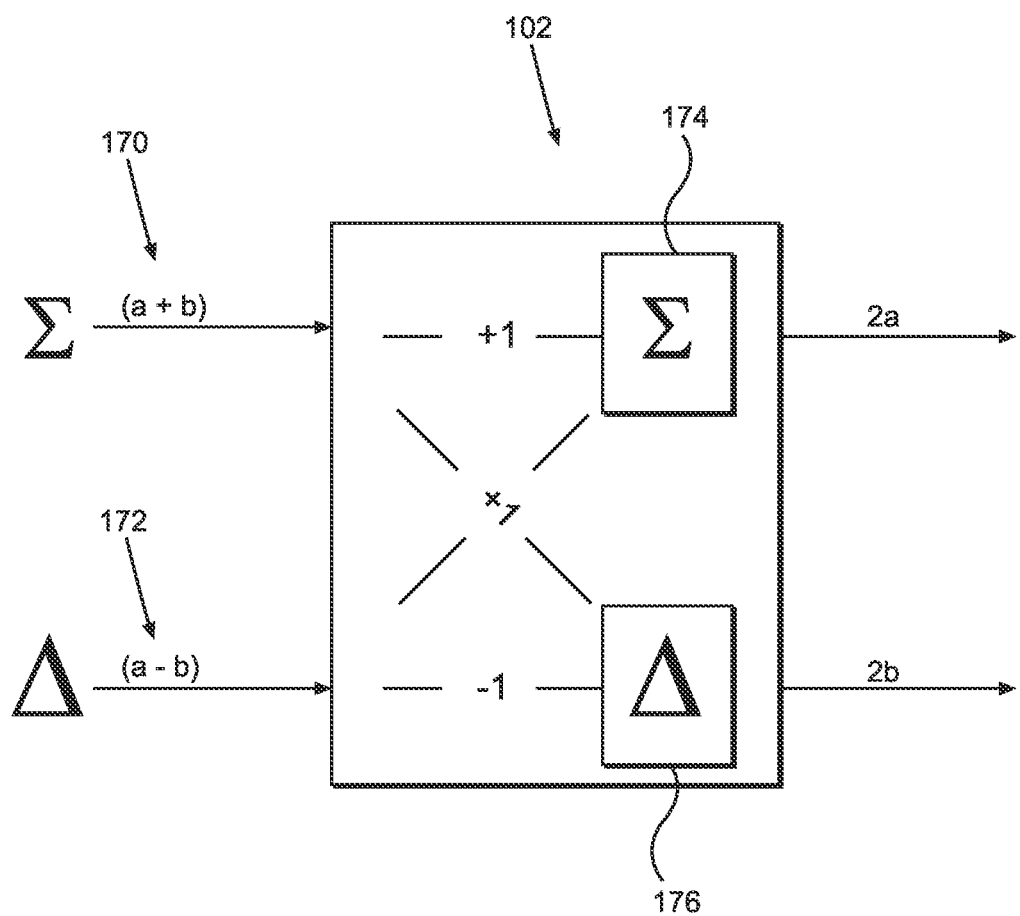
FIG. 5 is a simplified schematic of the sigma-delta network to extract amplified versions of the original signals.

While FIG. 4 shows one possible structure for the sigma-delta network, FIG. 5 provides a possible alternate schematic structure. In particular, FIG. 5 illustrates the sigma-delta circuit 102 where a sigma signal 170 (a+b) and a delta signal 172 (a−b) are input. Summation or additive circuitry 174 sums the signals 170, 172 ((a+b)+(a−b)=2a) to provide an output of 2a, which is an amplified version of the original input signal a. Likewise, the difference circuitry 176 takes the difference of the signals 170, 172 ((a+b)−(a−b)=a+b−a+b=2b) to provide an output of 2b, which is an amplified version of the original input signal b. Thus, some amplification (a factor of 2) is provided by the sigma-delta circuit 102, allowing the power amplifiers to be smaller and only needing to produce half the amplification of the conventional system. This built-in doubling of the signal accounts, in part, for the reduction in the need for larger power amplifiers.

Figure 6:
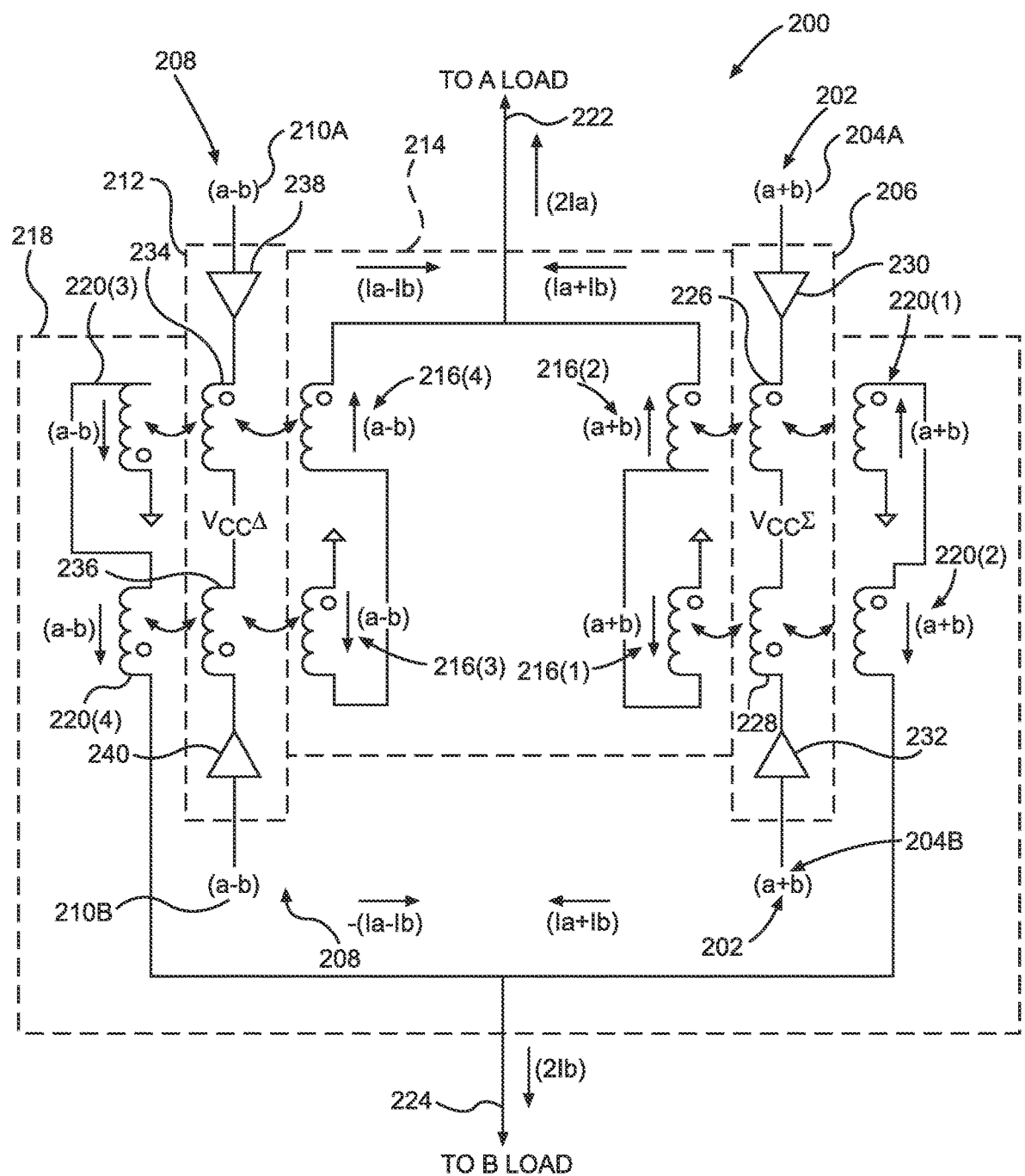
FIG. 6 is a circuit diagram of an exemplary differential power amplifier network used in the transmitter apparatus of FIG. 2 or FIG. 3 with inductors used for primary path coupling.
Figure 7:
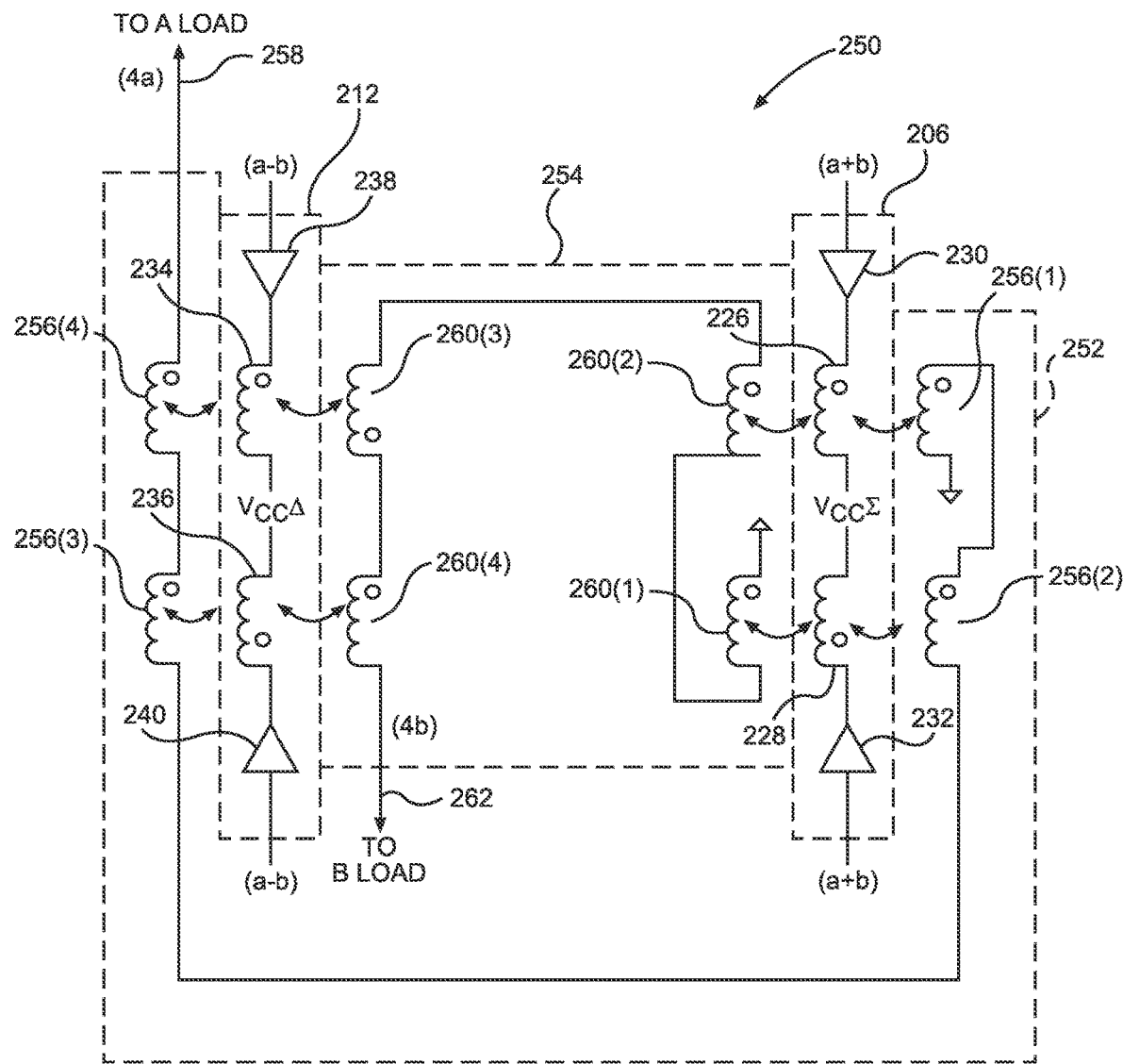
FIG. 7 is a circuit diagram of a second exemplary differential power amplifier network used in the transmitter apparatus of FIG. 2 or FIG. 3 with inductors used for primary path coupling.
Figures 8, 9:
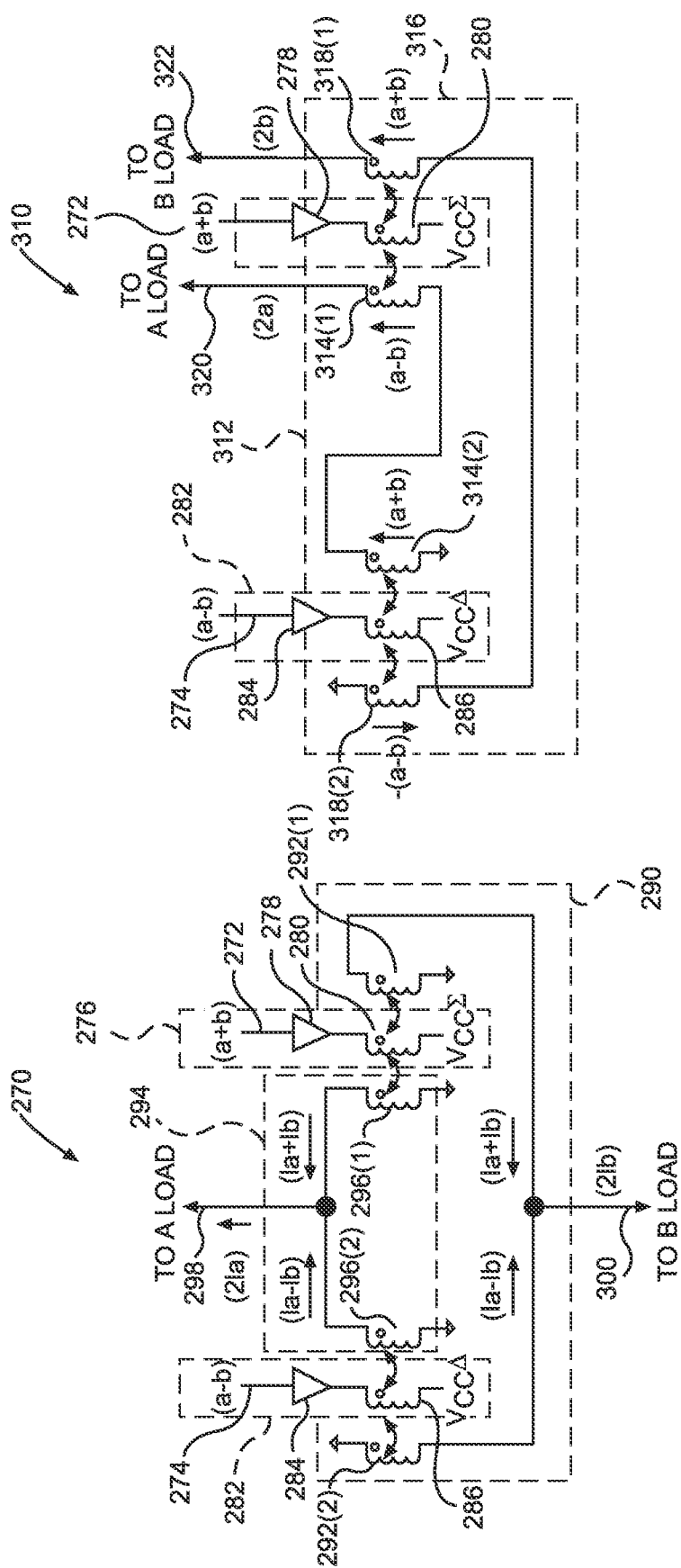
FIG. 8 is a circuit diagram of an exemplary single-ended power amplifier network used in the transmitter apparatus of FIG. 2 or FIG. 3 with inductors used for primary path coupling.
FIG. 9 is circuit diagram of a second exemplary single-ended power amplifier network used in the transmitter apparatus of FIG. 2 or FIG. 3.
Figure 10:
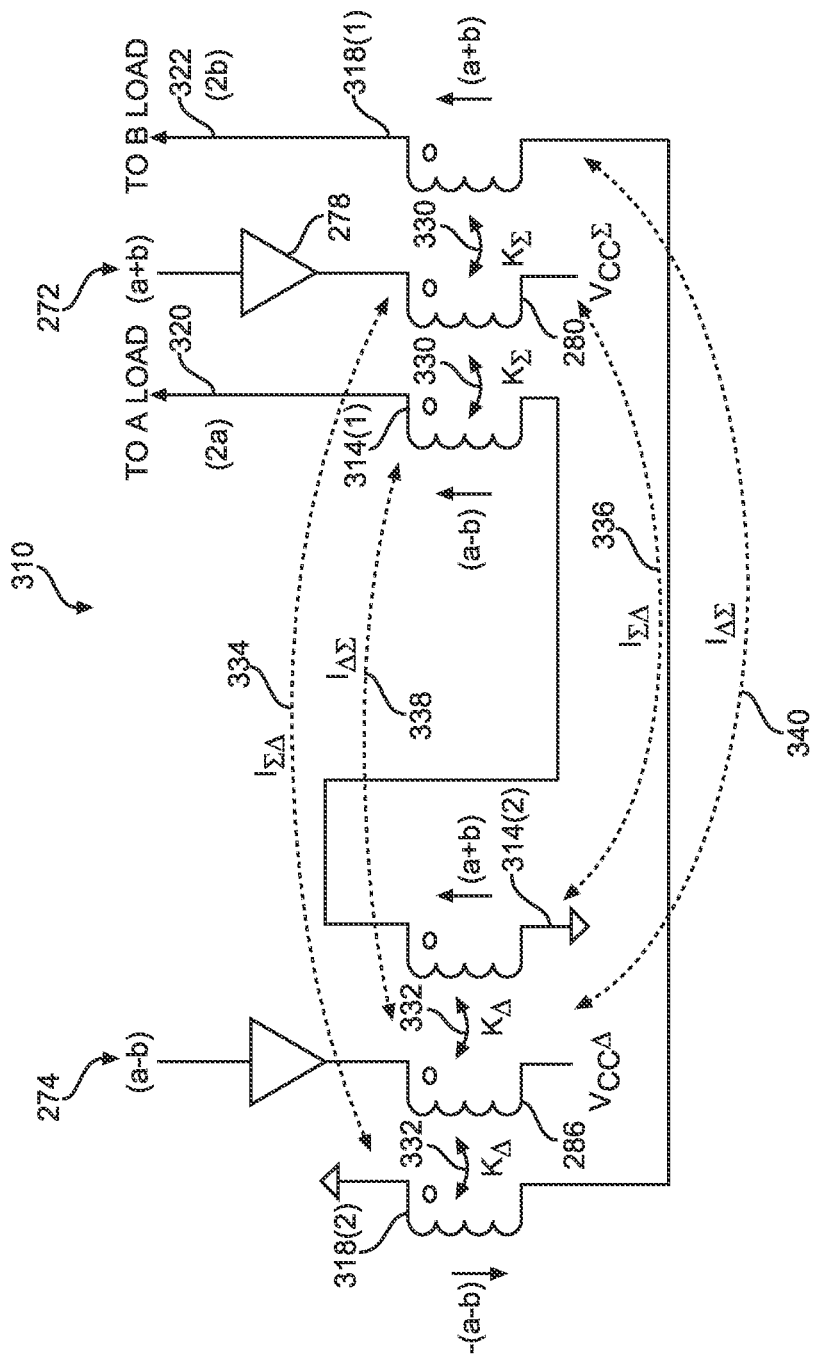
FIG. 10 is a circuit diagram of the power amplifier network of FIG. 9 with unwanted inductive coupling shown.

While various power amplifier circuits could be used with the sigma-delta circuits 76, 102, and 124, some specific power amplifier circuits combined with the second sigma-delta circuit are illustrated in FIGS. 6-9. The power amplifiers may be differential (FIGS. 6 and 7) or single ended (FIGS. 8 and 9) and may sum current (FIGS. 6 and 8) or sum voltage (FIGS. 7 and 9).

Turning to FIG. 6, a differential power amplifier network 200 is illustrated. A sigma signal 202 is provided at inputs 204A and 204B of a first primary transformer path 206. A delta signal 208 is provided at inputs 210A and 210B of a second primary transformer path 212.

The differential power amplifier network 200 further includes a first secondary transformer path 214 that operates to create an amplified version of the original first input signal a at a first output 222. The first secondary transformer path 214 includes four inductors 216(1)-216(4). Inductors 216(1) and 216(2) are coupled to the first primary transformer path 206 while inductors 216(3) and 216(4) are coupled to the second primary transformer path 212. Inductors 216(1) and 216(2) are coupled to one another in series. Likewise, inductors 216(3) and 216(4) are coupled to one another in series. However, inductors 216(1) and 216(2) are in parallel with inductors 216(3) and 216(4).

The differential power amplifier network 200 further includes a second secondary transformer path 218 that operates to create an amplified version of the original second input signal b at a second output 224. The second secondary transformer path 218 includes four inductors 220(1)-220(4). Inductors 220(1) and 220(2) are coupled to the first primary transformer path 206 while inductors 220(3) and 220(4) are coupled to the second primary transformer path 212. Inductors 220(1) and 210(2) are coupled to one another in series. Likewise, inductors 220(3) and 220(4) are coupled to one another in series. However, inductors 220(1) and 220(2) are in parallel with inductors 220(3) and 220(4).

The first primary transformer path 206 includes a first inductor 226 and a second inductor 228. The control signal VccΣ is supplied to the first primary transformer path 206 at the node between the first inductor 226 and the second inductor 228. The first inductor 226 has an associated first power amplifier 230 that is positioned between the first inductor 226 and the input 204A. The second inductor 228 has an associated second power amplifier 232 that is positioned between the second inductor 228 and the input 204B. The first inductor 226 couples to the inductors 216(2) and 220(1). The second inductor 228 couples to the inductors 216(1) and 220(2).

The second primary transformer path 212 includes a first inductor 234 and a second inductor 236. The control signal VccΔ, is supplied to the second primary transformer path 212 at the node between the first inductor 234 and the second inductor 236. The first inductor 234 has an associated first power amplifier 238 that is positioned between the first inductor 234 and the input 210A. The second inductor 236 has an associated second power amplifier 240 that is positioned between the second inductor 236 and the input 210B. The first inductor 234 couples to the inductors 216(4) and 220(3). The second inductor 236 couples to the inductors 216(3) and 220(4).

The arrangement of the power amplifier network 200 sums the current across the inductors and provides the desired outputs at outputs 222, 224. In contrast, the power amplifier network 250 of FIG. 7 sums the voltages of the inductors. The primary transformer paths 206 and 212 remain the same as do the inputs 204A, 204B, 210A, 210B. However, the power amplifier network 250 includes a first secondary transformer path 252 and a second secondary transformer path 254.

The first secondary transformer path 252 includes inductors 256(1)-256(4) arranged in series that provide an amplified signal at an output 258 corresponding to an amplified version of the first signal a. Inductor 256(1) couples to inductor 226. Inductor 256(2) couples to inductor 228. Inductor 256(3) couples to inductor 236. Inductor 256(4) couples to inductor 234. Similarly, the second secondary transformer path 254 includes inductors 260(1)-260(4) arranged in series that provide an amplified signal at an output 262 corresponding to an amplified version of the second signal b. Inductor 260(1) couples to inductor 228. Inductor 260(2) couples to inductor 226. Inductor 260(3) couples to inductor 234. Inductor 260(4) couples to inductor 236.

The single-ended approach is illustrated in FIGS. 8 and 9 and is similar, but with only a single input and fewer inductor coils in the transformer paths. In this regard, FIG. 8 illustrates a summed current aspect power amplifier network 270 having a first input 272 to receive the sigma signal and a second input 274 to receive the delta signal. The first input 272 is coupled to a first primary transformer path 276 that includes a power amplifier 278 coupled to an inductor 280. The inductor 280 also receives VccΣ from the ETIC. The second input 274 is coupled to a second primary transformer path 282. The second primary transformer path 282 includes a power amplifier 284 coupled to an inductor 286. The inductor 286 also receives VccΔ from the ETIC.

The power amplifier network 270 further includes a first secondary transformer path 290 that includes two inductors 292(1)-292(2), where the inductor 292(1) is coupled to the inductor 280 and the inductor 292(2) is coupled to the inductor 286. The power amplifier network 270 further includes a second secondary transformer path 294 that includes two inductors 296(1)-296(2), where the inductor 296(1) is coupled to the inductor 280 and the inductor 296(2) is coupled to the inductor 286. The inductors 292(1)-292(2) are connected in parallel to an output 298 that provides an amplified signal corresponding to the original input signal a. The inductors 296(1)-296(2) are connected in parallel to an output 300 that provides an amplified signal corresponding to the original input signal b.

FIG. 9 illustrates a summed voltage aspect power amplifier network 310. The primary transformer paths 272 and 274 remain the same. The power amplifier network 310 further includes a first secondary transformer path 312 that includes two inductors 314(1)-314(2), where the inductor 314(1) is coupled to the inductor 280 and the inductor 314(2) is coupled to the inductor 286. The power amplifier network 310 further includes a second secondary transformer path 316 that includes two inductors 318(1)-318(2), where the inductor 318(1) is coupled to the inductor 280 and the inductor 318(2) is coupled to the inductor 286. The inductors 314(1)-314(2) are connected in series to an output 320 that provides an amplified signal corresponding to the original input signal a. The inductors 318(1)-318(2) are connected in parallel to an output 322 that provides an amplified signal corresponding to the original input signal b.

In a perfect world, the inductors of the various transformer paths only couple to the respective transformers as described above. However, due to factors such as space constraints which cause all the inductors to be generally proximate one another, as illustrated in FIG. 10, there may be unwanted coupling between transformers. Specifically, FIG. 10 reproduces the power amplifier network 310 with desired couplings illustrated as KΣ 330 and KΔ 332. Unwanted couplings IΣΔ 334, 336 and IΔΣ 338, 340 are also illustrated. That is, the magnetic field generated by a given inductor may cause a current flow in any proximate inductor. This unwanted coupling and unwanted current flow may negatively affect the output signals generated by the sigma-delta circuit.

Using the power amplifier network 310, the unwanted coupling may be expressed mathematically as follows. Specifically, the outputs 320, 322 have output signals that can be expressed as follows:

Output 320=$K_\Sigma^*(a+b)+K_\Delta^*(a-b)+I\Delta\Sigma^*(a-b)+I_{\Sigma\Delta}^*(a+b)$ Output 322=$K_\Sigma^*(a+b)-K_\Delta^*(a-b)+I_{\Sigma\Delta}^*(a+b)-I_{\Delta\Sigma}^*(a-b)$ If equal desired coupling is present, that is, K=$K_\Sigma$=$K_\Delta$, then the following holds:

Output 320=$2^*K^*a+I_{\Delta\Sigma}^*(a-b)+I_{\Sigma\Delta}^*(a+b)$

Output 322=$2^*K^*b+I\Sigma\Delta^*(a+b)-I_{\Delta\Sigma}^*(a-b)$

And if the cross-coupling terms are nulled, that is, $I_{\Delta\Sigma}$=$I_{\Sigma\Delta}$=0, then the following holds:

Output 320=$2^*K^*a$

Output 322=$2^*K^*b$

However, in most situations, $I_{\Delta\Sigma}$=$I_{\Sigma\Delta}$=0 is not true and, as a result, the signal is distorted by the values of either $I_{\Delta\Sigma}^*(a-b)+I_{\Sigma\Delta}^*(a+b)$ for output 320 (hereinafter referred to as unwanted coupling π1) or $I_{\Sigma\Delta}^*(a+b)-I_{\Delta\Sigma}^*(a-b)$ (hereinafter referred to as π2) for output 322.

While illustrated only for the power amplifier network 310, it should be appreciated that similar cross-coupling could be shown for any of the other power amplifier networks 208, 250, and 270. While the math for the power amplifier networks 208 and 250 is more complex because of the additional transformers and the possibility of more unwanted couplings, tracking the math through the additional complexity is considered to be within the skill of those ordinarily skilled in the art.

Regardless of which power amplifier network is used, it should further be appreciated that in the presence of an unequal desired coupling term and cross-coupling terms (i.e., π1 or π2 is not equal to zero), the RF signal b appears at the antenna 66 and RF signal a appears at the antenna 68. In general, it is assumed that the antenna-to-antenna isolation is about 20-25 dB. Accordingly, it may be appropriate to have less than −30 dB undesired cross-coupling. The target −30 dB is exemplary, and other values may be chosen, but this value is considered appropriate so that the isolation of the signals is greater than the antenna-to-antenna isolation.

Exemplary aspects of the present disclosure contemplate reducing or eliminating the unwanted cross-coupling component (i.e., π1 or π2=0). This reduction may be effectuated through a digital compensation where the two signals are created with coupling some a and b terms with appropriate gain and phase. Rather than creating a sigma term that is just the sum of a and b, a modified sigma term ai+bi+ad*bi is digitally created with ad as a complex correction term. Likewise, rather than creating a delta term that is just the difference of a and b, a modified delta term ai−bi+βd*ai is digitally created with βd as a complex correction term.

The term αd and βd may adjusted so as to cancel the b term at the output 320 and cancel the a term at the output 322, based on the following equations, for example:

Output 320=$K_\Sigma^*(a+b+\alpha d^*b)+K_\Delta^*(a-b+\beta d^*a)+I_{\Delta\Sigma}^*(a-b+\beta d^*a)+I\Sigma\Delta^*(a+b+\alpha d^*b)$ Output 322=$K_\Sigma^*(a+b+\alpha d^*b)-K_\Delta^*(a-b+\beta d^*a)+I_{\Sigma\Delta}^*(a+b+\alpha d^*b)-I_{\Delta\Sigma}^*(a-b+\beta d^*a)$ Output 320=$a^*(K_\Sigma+K_\Delta+I_{\Delta\Sigma}+I_{\Sigma\Delta}+\beta d^*K_\Delta+\beta d^*I_{\Delta\Sigma})+b^*(K_\Sigma-K_\Delta-I_{\Delta\Sigma}+I_{\Sigma\Delta}+\alpha d^*K_\Sigma+\alpha d^*I_{\Sigma\Delta})$ Output 322=$b^*(K_\Sigma+K_\Delta+I_{\Delta\Sigma}+I_{\Sigma\Delta}+\alpha d^*K_\Sigma+\alpha d^*I_{\Sigma\Delta})+a^*(K_\Sigma-K_\Delta-I_{\Delta\Sigma}+I_{\Sigma\Delta}-\beta d^*K_\Delta-\beta d^*I_{\Delta\Sigma})$ To cancel the b term coefficient at output 320 and the a term coefficient at output 322, the following holds:

$K_\Sigma-K_\Delta-I_{\Delta E}+I_{\Sigma\Delta}+\alpha d^*K_\Sigma+\alpha d^*I_{\Sigma\Delta}=0$ $K_\Sigma-K_\Delta-I_{\Delta E}+I_{\Sigma\Delta}-\beta d^*K_\Delta-\beta d^*I_{\Delta\Sigma}=0$ $\alpha d=[(K_\Delta-K_\Sigma)+(I_{\Delta\Sigma}-I_{\Sigma\Delta})]/(K_\Sigma+I_{\Sigma\Delta})$ $\beta d=-[(K_\Delta-K_\Sigma)+(I_{\Delta\Sigma}-I_{\Sigma\Delta})]/(K_\Delta+I_{\Delta\Sigma})$ The correction term depends on the difference between the desired coupling term $K_\Delta-K_\Sigma$ and the difference between the undesired cross-coupling terms $I_{\Delta\Sigma}-I_{\Sigma\Delta}$. Note that the coefficient term of a on output 320 is equal to $2^*(K_\Sigma+I_{\Sigma\Delta})$. Also note that the coefficient term of b on output 322 is equal to $2^*(K\Delta+I_{\Delta\Sigma})$.

Figure 11:
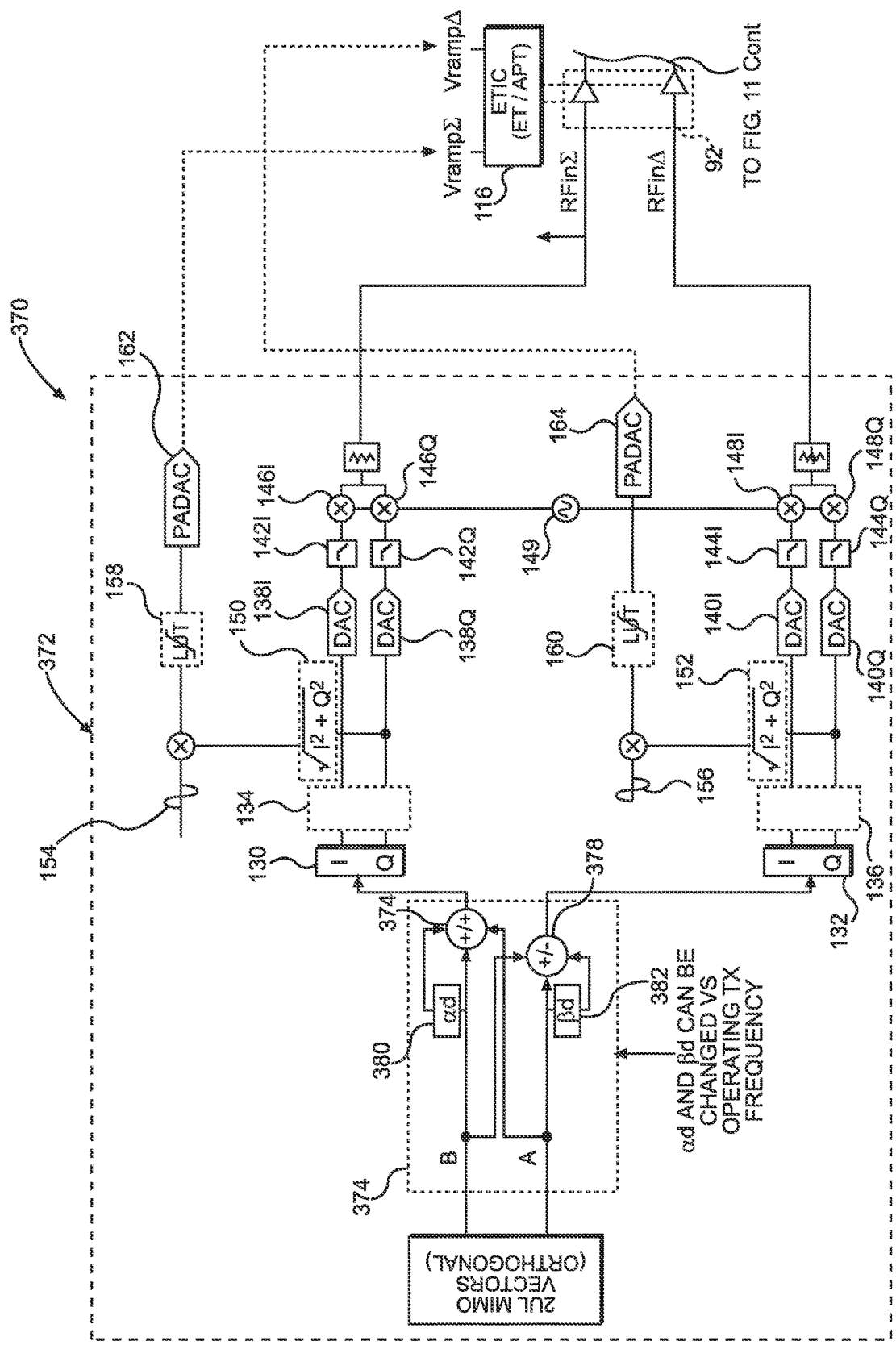
FIG. 11 is a circuit diagram of the transceiver circuit with a predistortion circuit included to offset the unwanted inductive coupling of a sigma-delta circuit.
Figure 11:
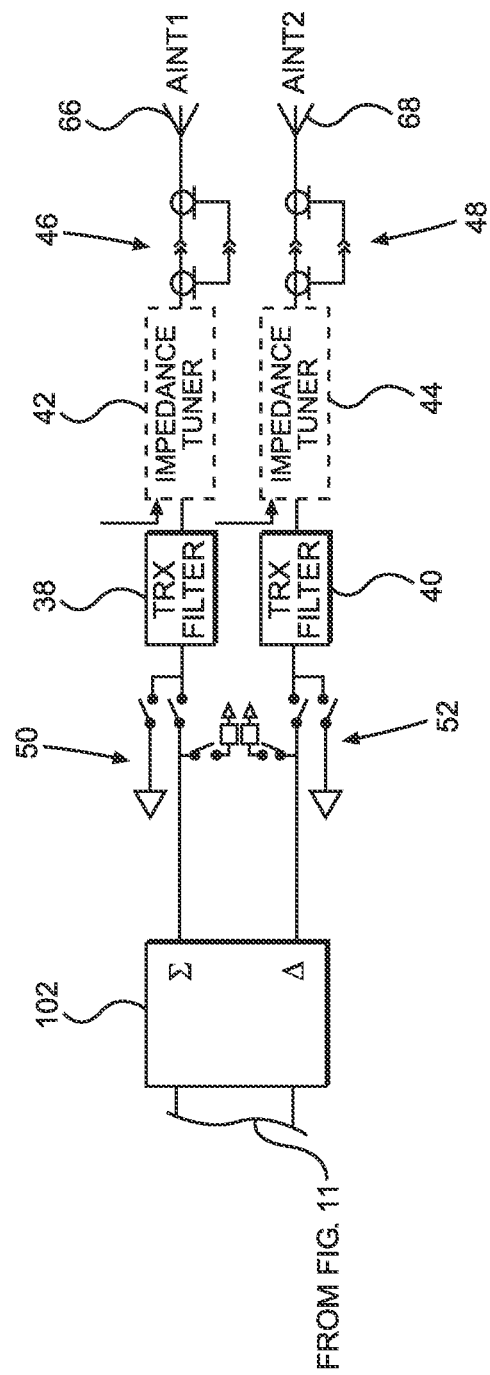
Figure 12:
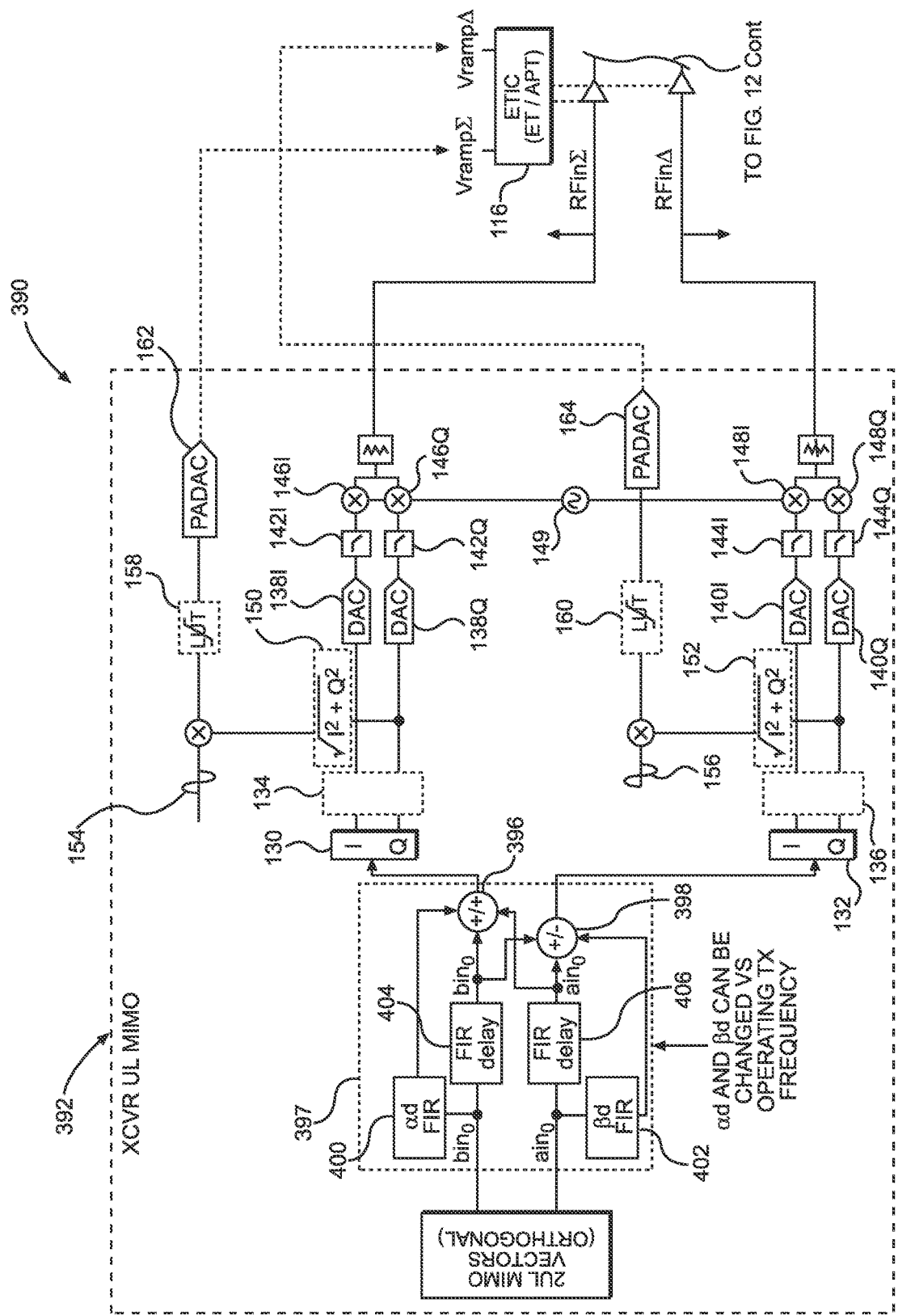
FIG. 12 is a circuit diagram of the transceiver circuit of FIG. 11 with a finite impulse response (FIR) pre-distortion circuit included to offset the unwanted inductive coupling of the sigma-delta circuit.
Figure 12:
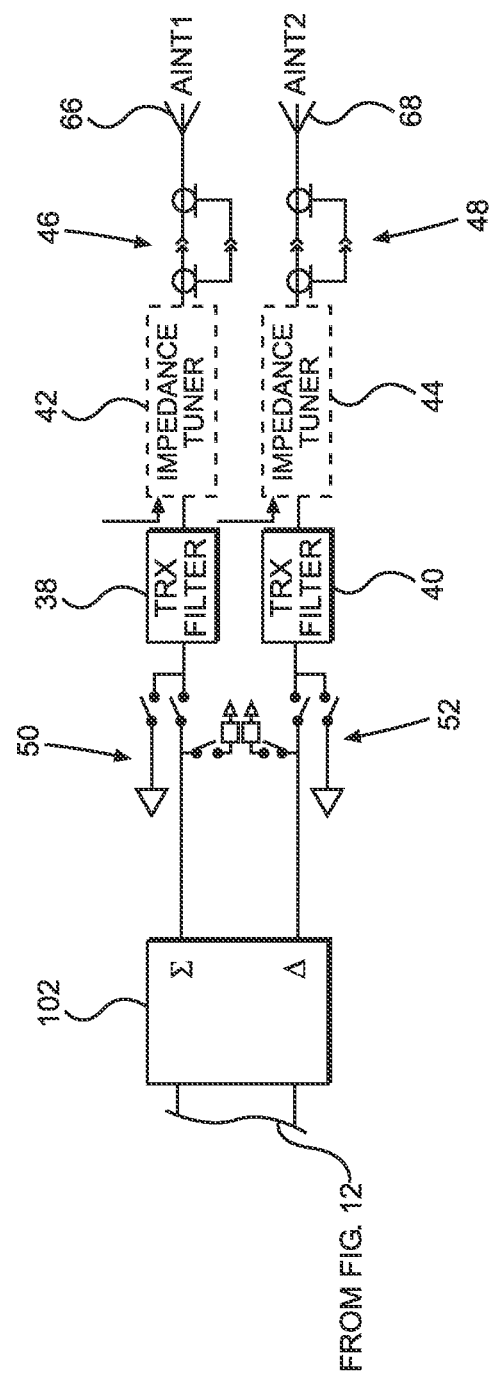

To provide this correction term, the initial sigma-delta network (either in the transceiver or external thereto) is modified to include circuitry that adds the correction term during the summation and difference creation. Exemplary aspects are illustrated in FIGS. 11 and 12. While FIGS. 11 and 12 only show the modification to the sigma-delta network in the transceiver, the present disclosure contemplates that an external sigma-delta network such as the sigma-delta network 76 of FIG. 2 may likewise be so modified.

In this regard, FIG. 11 illustrates a transmitter apparatus 370 that is, in many respects nearly identical to the transmitter apparatus 120 and similar elements use the same numbers without duplicating the description herein. The transmitter apparatus 370 includes a transceiver circuit 372, which in turn includes a first sigma-delta circuit 374. The first sigma-delta circuit 374 includes summation or additive circuitry 376 and difference circuitry 378. However, in addition to summing a and b, the summation circuitry 376 also sums ad provided by a compensation circuit 380. Likewise, in addition to taking the difference of a and b, the difference circuitry 378 also adds βd provided by a second compensation circuit 382. Note that the compensation circuits 380, 382 may provide different values based on frequency. That is, the cross-coupling of the inductors in the second sigma-delta network 102 may vary based on frequency. Accordingly, the compensation values may also vary by frequency to track the coupling changes.

FIG. 12 is similar in that it shows a transmitter apparatus 390 that includes a transceiver circuit 392, which in turn includes a first sigma-delta circuit 394. The first sigma-delta circuit 394 includes summation or additive circuitry 396 and difference circuitry 398. However, in addition to summing a and b, the summation circuitry 396 also sums ad provided by a compensation circuit 400, which is a finite impulse response (FIR) circuit. Likewise, in addition to taking the difference of a and b, the difference circuitry 398 also adds βd provided by a second compensation circuit 402, which is also a FIR circuit. Further, FIR delay circuits 404 and 406 are added prior to the summation circuit 396 and difference circuit 398. Note that the compensation circuits 400, 402 may provide different values based on frequency. That is, the cross-coupling of the inductors in the second sigma delta network 102 may vary based on frequency. Accordingly, the compensation values may also vary by frequency to track the coupling changes.

Those skilled in the art will recognize improvements and modifications to the preferred embodiments of the present disclosure. All such improvements and modifications are considered within the scope of the concepts disclosed herein and the claims that follow.

What is claimed is:

1. A transmitter apparatus comprising:
a first sigma-delta network comprising:
an input configured to receive a first signal and a second signal;
a first compensation circuit configured to provide a first compensation signal;
first additive circuitry configured to sum the first signal, the first compensation signal, and the second signal to create a sigma signal;
a second compensation circuit configured to provide a second compensation signal;
first difference circuitry configured to subtract the second signal from a sum of the second compensation signal and the first signal to create a delta signal;
a sigma output coupled to the first additive circuitry; and
a delta output coupled to the first difference circuitry;
a first power amplifier coupled to the sigma output, the first power amplifier comprising a summed output;
a second power amplifier coupled to the delta output, the second power amplifier comprising a difference output; and
a second sigma-delta network comprising:
a summed input coupled to the summed output and configured to receive an amplified sigma signal;

a difference input coupled to the difference output and configured to receive an amplified delta signal;

second additive circuitry configured to sum the amplified sigma signal and the amplified delta signal to create an amplified first signal;

second difference circuitry configured to subtract the amplified delta signal from the amplified sigma signal to create an amplified second signal;

a first output coupled to the second additive circuitry; and a second output coupled to the second difference circuitry.

2. The transmitter apparatus of claim 1, further comprising a transceiver circuit configured to generate control signals for the first and second power amplifiers.

3. The transmitter apparatus of claim 2, wherein the transceiver circuit is coupled to the input of the first sigma-delta network.

4. The transmitter apparatus of claim 2, wherein the transceiver circuit comprises at least the first sigma-delta network.

5. The transmitter apparatus of claim 2, further comprising an envelope tracking integrated circuit (ETIC) coupled to the transceiver circuit and configured to receive the control signals.

6. The transmitter apparatus of claim 5, wherein the ETIC is coupled to the first and second power amplifiers and controls the first and second power amplifiers based on the control signals.

7. The transmitter apparatus of claim 1, wherein the first compensation circuit is configured to provide the first compensation signal as a function of transmission frequency.

8. The transmitter apparatus of claim 1, wherein the first compensation signal is configured to compensate for coupling between inductors in at least one of the first and second sigma-delta networks.

9. The transmitter apparatus of claim 1, wherein the first compensation circuit comprises a finite impulse response (FIR) circuit.

10. The transmitter apparatus of claim 1, wherein the first power amplifier comprises a differential power amplifier.

11. The transmitter apparatus of claim 1, wherein the first power amplifier comprises a single-ended power amplifier.

12. The transmitter apparatus of claim 10, wherein the first power amplifier comprises:

a first primary transformer path;

a first secondary transformer path coupled to the first primary transformer path; and a second secondary transformer path coupled to the first primary transformer path.

13. The transmitter apparatus of claim 12, wherein the first secondary transformer path comprises:

two inductors; and a current output configured to provide a sum of current across the two inductors.

14. The transmitter apparatus of claim 12, wherein the first secondary transformer path comprises:

two inductors; and a voltage output configured to provide a sum of voltage across the two inductors.

15. A transceiver circuit comprising:

a sigma-delta network comprising:

an input configured to receive a first signal and a second signal;

a first compensation circuit configured to provide a first compensation signal;

first additive circuitry configured to sum the first signal, the first compensation signal, and the second signal to create a sigma signal;

a second compensation circuit configured to provide a second compensation signal;

first difference circuitry configured to subtract the second signal from a sum of the second compensation signal and the first signal to create a delta signal;

a sigma output coupled to the first additive circuitry; and a delta output coupled to the first difference circuitry.

16. The transceiver circuit of claim 15, wherein the first compensation circuit is configured to provide the first compensation signal as a function of transmission frequency.

17. The transceiver circuit of claim 15, wherein the first compensation signal is configured to compensate for coupling between inductors in the sigma-delta network.

18. The transceiver circuit of claim 15, wherein the first compensation circuit comprises a finite impulse response (FIR) circuit.

19. The transceiver circuit of claim 18, further comprising an FIR delay circuit.

* * * * *

UNITED STATES PATENT AND TRADEMARK OFFICE
CERTIFICATE OF CORRECTION

PATENT NO. : 11,387,795 B2
APPLICATION NO. : 17/154394
DATED : July 12, 2022
INVENTOR(S) : Nadim Khlat and Terry J. Stockert Page 1 of 1

It is certified that error appears in the above-identified patent and that said Letters Patent is hereby corrected as shown below:

In the Specification

Column 7, Lines 59-63, replace "digital-to-analog converters (DACs) 138I, 138Q, 140I, and 140Q before filtering by filters 142I, 142Q, 144I, and 144Q. The filtered signals are upconverted to an RF frequency by mixers 146I, 146Q, 148I, and 148Q" with --digital-to-analog converters (DACs) 138I, 138Q, 140I, and 140Q before filtering by filters 142I, 142Q, 144I, and 144Q. The filtered signals are upconverted to an RF frequency by mixers 146I, 146Q, 148I, and 148Q--.

Column 8, Line 1, replace "root of the sum of squares of the 1 and Q components" with --root of the sum of squares of the I and Q components--.

Column 9, Line 21, replace "the input 210B" with --the input 210B--.

Column 10, Lines 42-44, replace "Output $320 = K_\Sigma*(a+b) + K_\Delta*(a-b) + I_{\Delta\Sigma}*(a-b) + I_{\Sigma\Delta}*(a+b)$" with --Output $320 = K_\Sigma*(a+b) + K_\Delta*(a-b) + I_{\Delta\Sigma}*(a-b) + I_{\Sigma\Delta}*(a+b)$--.

Column 10, Line 52, replace "Output $322 = 2*K*b + I_{\Sigma\Delta}*(a+b) - I_{\Delta\Sigma}*(a-b)$" with --Output $322 = 2*K*b + I_{\Sigma\Delta}*(a+b) - I_{\Delta\Sigma}*(a-b)$--.

Column 11, Lines 24 and 25, replace "ad" with --αd--.

Column 11, Lines 32-34, replace "Output $320 = K_\Sigma*(a+b+\alpha d*b) + K_\Delta*(a-b+\beta d*a) + I_{\Delta\Sigma}*(a-b+\beta d*a) + I_{\Sigma\Delta}*(a+b+\alpha d*b)$" with --Output $320 = K_\Sigma*(a+b+\alpha d*b) + K_\Delta*(a-b+\beta d*a) + I_{\Delta\Sigma}*(a-b+\beta d*a) + I_{\Sigma\Delta}*(a+b+\alpha d*b)$--.

Column 11, Line 45, replace "$K_\Sigma - K_\Delta - I_{\Delta E} + I_{\Sigma\Delta} + \alpha d*K_\Sigma + \alpha d*I_{\Sigma\Delta} = 0$" with --$K_\Sigma - K_\Delta - I_{\Delta\Sigma} + I_{\Sigma\Delta} + \alpha d*K_\Sigma + \alpha d*I_{\Sigma\Delta} = 0$--.

Column 11, Line 46, replace "$K_\Sigma - K_\Delta - I_{\Delta E} + I_{\Sigma\Delta} - \beta d*K_\Delta - \beta d*I_{\Delta\Sigma} = 0$" with --$K_\Sigma - K_\Delta - I_{\Delta\Sigma} + I_{\Sigma\Delta} - \beta d*K_\Delta - \beta d*I_{\Delta\Sigma} = 0$--.

Column 12, Lines 10 and 24, replace "sums ad" with --sums αd--.

Signed and Sealed this
Twentieth Day of September, 2022

*Katherine Kelly Vidal*

Katherine Kelly Vidal
*Director of the United States Patent and Trademark Office*